United States Patent
Sudo et al.

(10) Patent No.: US 6,410,840 B1
(45) Date of Patent: Jun. 25, 2002

(54) THERMOELECTRIC CONVERSION DEVICE AND METHOD OF MANUFACTURING THE SAME

(75) Inventors: Shuzo Sudo; Matsuo Kishi; Hirohiko Nemoto, all of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/639,710

(22) Filed: Aug. 14, 2000

(30) Foreign Application Priority Data

Aug. 24, 1999 (JP) .............................................. 11-237348

(51) Int. Cl.[7] .............................................. H01L 35/34
(52) U.S. Cl. ........................ 136/201; 136/205; 136/237
(58) Field of Search ................................ 136/201, 211, 136/212, 236.1, 237

(56) References Cited

FOREIGN PATENT DOCUMENTS

EP    1 079 445    *    2/2001

* cited by examiner

Primary Examiner—Kathryn Gorgos
Assistant Examiner—Thomas H Parsons
(74) Attorney, Agent, or Firm—Adams & Wilks

(57) ABSTRACT

A thermoelectric conversion device is manufactured by the following steps of forming. A metallic material is formed on a substrate. A photosensitive resin pattern is formed on the metallic material. Patterned n-type or p-type thermoelectric material elements having a predetermined thickness and electrode junction layers are formed by plating. Next, the photosensitive resin pattern is dissolved and the metallic material is removed. And the substrate having the p-type thermoelectric material elements and the substrate having the n-type thermoelectric material elements are joined with the electrode junction layers interposed between the each thermoelectric material elements and the opposed substrate.

18 Claims, 10 Drawing Sheets

THERMOELECTRIC CONVERSION DEVICE AND METHOD OF MANUFACTURING THE SAME

BACKGROUND OF THE INVENTION

1. Field of the Invention

The present invention relates to a thermoelectric conversion device having elements constituted of p-type and n-type thermoelectric materials and capable of enabling temperature-difference power generation (thermal power generation) based on the Seebeck effect or electronic cooling and heating based on the Peltier effect and a method of manufacturing.

2. Description of the Related Art

The construction of a conventional thermoelectric conversion device for converting heat into electricity or converting electricity into heat and a method for manufacturing the thermoelectric conversion device will be described with reference to FIGS. 14 to 16. The conventional thermoelectric conversion device is constructed in such a manner that, as shown in FIG. 14, n-type elements 505 and p-type elements 605 are interposed between a lower substrate 601 having a lower electrode wiring 604 provided on its surface and an upper substrate 501 having an upper electrode wiring 504 provided on its surface. Also, as shown in FIG. 16, p-type elements 605 and n-type elements 505 are electrically connected in series to each other to form pn junctions, and are connected to an external electrical circuit by external connection electrodes 608. Thermoelectric materials ordinarily used at room temperature not exceeding a temperature of about 200° C. are Bi—Te materials. The material of the p-type elements is a chemical compound semiconductor mainly composed of Bi, Te and Sb. The material of the n-type elements is a chemical compound semiconductor mainly composed of Bi, Te and Se.

When, in the above-described thermoelectric conversion device, a direct current is caused to flow through the external connection electrode 608 provided at both end portions of the thermoelectric conversion device, heat absorption or heat development occurs at each of the interface at which the upper electrode wiring 504 contacts the elements 505 and 506 and the interface between at which the lower electrode wiring 604 contacts the elements 505 and 506, thus creating a temperature difference between the two faces of the thermoelectric conversion device. Conversely, when there is a temperature difference between the upper electrode wiring 504 and the lower electrode wiring 604, it is possible to extract power from the external connection electrodes 608.

A method for manufacturing such a thermoelectric conversion device will next be described. FIG. 15 shows an element joining method in a conventional thermoelectric conversion device manufacturing method in a case where elements formed from thermoelectric materials are monocrystals, or where a sintering process is used. First, on a thermoelectric material processed to have the shape of a plate or rod, a layer of Ni or the like is formed by plating. This layer is formed on the flat surfaces of the thermoelectric member which are to be joined to the substrates. The thermoelectric member is cut into rectangular blocks, and electrode joint layers for soldering are provided on opposite end surfaces. In this manner, p-type elements 605 having electrode joint layers 606 and 607 and n-type elements 505 having electrode joint layers 506 and 507 are made. Then, the completed p-type elements 605 and n-type elements 505 are respectively set in predetermined places on the electrode wirings with a jig or the like, and the elements and the electrode wirings are joined to each other by the electrode joint layers, thus manufacturing a thermoelectric conversion device. FIG. 16 shows a see-through view of the thermoelectric conversion device manufactured by this process.

Ordinary conventional thermoelectric material forming methods are represented by the above-mentioned method of directly cutting a monocrystal into elements, and the method of pulverizing a monocrystal into a powder, sintering the powder and cutting the sintered material into elements. Sol-gel methods, electroplating methods, flash evaporation methods are presently being studied.

A process based on an electroplating method disclosed in Japanese Patent Laid-Open Publication No. 22533/1998 will be outlined. First, a mask pattern is formed on a plating electrode made of Ti or the like on a plating substrate. This plating substrate is then placed in an acid plating solution together with an opposed electrode and a current is caused to flow therethrough.

When the growth of a plating layer to a certain thickness is attained, the substrate with the plating layer is taken out of the liquid plate and the plating layer is transferred onto an insulating substrate. As a transfer method, a method of physically shaving the plating substrate may be used. In this process, however, a method of stripping from the plating substrate by using the adhesion of an adhesive on the insulating material is used. The step of forming an insulating layer on the stripped off plating layer and transferring another plating layer onto the insulating layer is repeated several ten times to make a laminated block. Internal electrodes for pn junction are directly formed on end surfaces of the block by vacuum deposition or the like.

In the thermoelectric conversion device using monocrystals or sintered members as its elements, however, shorting by contact between the elements or failure of contact of the elements with the electrodes can occur easily due to a move of the elements on solder at the time of joining when the both sides of the elements are soldered to fix the elements. Also, since the elements having the shape of a rectangular block are made by cutting the thermoelectric material in the form of a plate, corner portions of the elements can crack or chip easily and a stress due to heat or an external force is concentrated in corner portions of the elements to increase the possibility of breakage. Therefore, there is a problem of a reduction in the yield or instability of the yield in mass production of the thermoelectric conversion device.

In the thermoelectric conversion device manufacturing method using a monocrystal or a sintered member to form elements, the elements formed from a thermoelectric material is a rectangular block one side of which (one in the direction of thickness and one of the bottom sides) has a length of, at the minimum, several hundred micrometers, depending upon restrictions in terms of machining and ease of handling. To obtain a high electromotive force by using such elements with respect to a small temperature difference, it is necessary to connect several thousand elements in series. However, it is very difficult to manufacture a thermoelectric conversion device in which several thousand worked elements are arrayed one by one on a substrate and connected in series.

Even if it is possible, the size of the thermoelectric conversion device is so large that the device is difficult to mass-produce at a low cost.

In the case of the manufacturing method disclosed in Japanese Patent Laid-Open Publication No. 22533/1998, a sufficiently stable yield cannot be expected with respect to plating transfer. Also, the device using laminated blocks having intermediate layers of an insulating material has a heat flow loss larger than that of the device having air between the elements, and cannot generate sufficient power when the temperature difference is small. Also, according to the method, the internal electrodes for series connection of the elements are joined directly to the elements and, therefore, the electrical resistance and the loss of heat are reduced. In practice, however, there is a need to polish the end surfaces of the blocks, so that it is difficult to manufacture the device at a low cost. Further, positioning marks cannot be used at the time of forming the internal electrodes, and it is difficult to form the internal electrode with sufficiently high reliability.

For these reasons, it is very difficult to manufacture a small, thin, compact thermoelectric conversion device with stability at a low cost by any of the conventional manufacturing methods.

SUMMARY OF THE INVENTION

It is an object of the present invention to solve the above-described problems, the present invention arranges a device as described below. That is, a thermoelectric conversion device of the present invention has p-type and n-type elements pn-junctioned by wiring of internal electrodes of two substrates opposed to each other, at least one of the p-type and n-type elements having, on only its one side, an electrode junction layer for joining to the internal electrode.

According to the present invention, the element is formed of a p-type or n-type thermoelectric material containing at least two elements selected from Bi, Te, and Sb deposited from an acid water solution by an electrochemical technique.

Further, the electrode junction layer is formed of a plurality of layers.

Also, the sectional shape of the p-type element or the n-type element is circular or elliptical.

Also, the surface of the respective element adjacent to the electrode junction layer has a surface roughness larger than the surface opposite from the surface adjacent to the electrode junction layer.

Also, the internal electrode wiring is formed of at least a conductive layer for internal pn junction, and a junction layer for joining the substrate and the conductive layer.

Further, the conductive layer is a metal layer having Ni as a main constituent.

Also, the substrates are Si substrates with a $SiO_2$ layer.

As a manufacturing method for realizing the above-described thermoelectric conversion device, manufacturing methods described below are used. That is, a manufacturing method of the present invention comprises a first step of forming an internal electrode on a substrate, a second step of forming a mask pattern on the substrate such that at least a portion of the internal electrode is exposed, a third step of forming an element of a thermoelectric material on the exposed internal electrode by plating the substrate by an electrochemical technique, a fourth step of forming an electrode junction layer on the element, a fifth step of removing the mask pattern, and a sixth step of forming a pn junction by joining the electrode junction layer and an electrode provided on an opposed substrate opposed to the substrate.

Also, another manufacturing method comprises the steps of providing a metallic material on a substrate, forming a mask pattern on the substrate so that at least a portion of the metallic material is exposed, forming an element of a thermoelectric material on the exposed metallic material by plating the substrate by an electrochemical technique, forming an electrode junction layer on the element, removing the mask pattern, forming an electrode for pn junction by partially removing the metallic material, and joining the electrode junction layer and an electrode provided on an opposed substrate opposed to the substrate.

Still another manufacturing method comprises the steps of forming a first metal layer on a substrate, forming a plurality of internal electrodes by patterning on the first metal layer, forming a mask pattern on the substrate so that the internal electrodes are exposed at least partially, forming an element of a thermoelectric material on the exposed internal electrodes by plating the substrate by an electrochemical technique, forming an electrode junction layer on the element, removing the mask pattern, forming an electrode pattern from the first metal layer by etching the first metal layer using the internal electrodes as a mask, and forming pn junction by pressing and heating the electrode junction layer and an electrode provided on an opposed substrate opposed to the substrate so that the electrode junction layer and the electrode are joined to each other.

Further, a step of processing the p-type and n-type elements by a heat treatment is included.

As described above, since the pattern for forming the element is formed of a photosensitive resin, the element can be easily formed so as to be circular or elliptical. That is, stronger elements not easily broken by cracking, chipping or an external force can be realized.

P-type and n-type elements are directly shaped on a substrate by plating. Therefore, there is no need for an electrode junction layer between the elements shaped by plating and the substrate, and the electrode junction layer is provided on only one side of the element. The thermal resistance and the possibility of a contact failure at the time of joining for forming a thermoelectric conversion device, can be reduced. When the electrode junction layers on the elements are jointed to another substrate, since one side of the elements have already been fixed, there is no possibility of occurrence of a short circuit between the elements or a contact failure caused by a move of the elements. Thus, the reduction in yield and variations in qualities can be limited. Since the elements are caused to grow by plating, the junction interface between the elements and the electrode junction layers can be easily roughened suitably to have a surface roughness of several microns, corresponding to the crystal grain size of a Bi—Te material. The area of contact with the junction layer is thereby increased in comparison with the flat junction surface, and the possibility of contact and bonding failures is reduced. As a result, the strength of junction between the electrode junction layers and the substrate is improved. Also, as a conductive layer for electrically connecting p-type and n-type elements in series, only a single metal layer is used. The process can therefore be simplified and a reduction in cost can be achieved. Also, two metal layers may be provided on one substrate while the single metal layer is used on the other substrate, thereby increasing the electrical conductivity as well as achieving a cost reduction effect. Thus, the invention is advantageous in an application to a thermoelectric conversion device using small elements. Also, since the plating substrate and the substrate used for the thermoelectric conversion device are the same, a further reduction in cost can be achieved.

DETAILED DESCRIPTION OF THE PREFERRED EMBODIMENT

Figure 1:
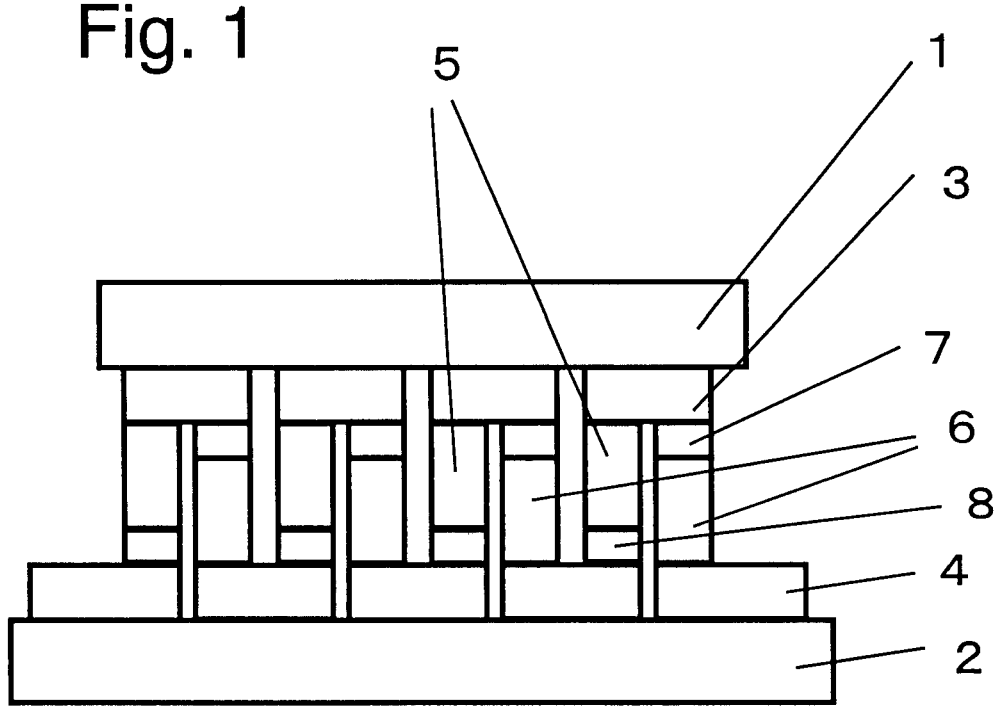
FIG. 1 is a side view of a thermoelectric conversion device of the present invention.

An embodiment of the present invention will be described with reference to FIG. 1. An insulating substrate or a silicon substrate processed to have an insulating effect is used as each of an upper substrate 1 and a lower substrate 2. An upper electrode wiring 3 and a lower electrode wiring 4 are respectively formed on the respective substrates. Elements 6 formed of, for example, a p-type thermoelectric material is provided on the lower electrode wiring 4. Each element 6 is joined to the upper electrode wiring 3 by an electrode junction layer 7. On the other hand, elements 5 formed of, for example, n-type thermoelectric material is provided on the upper electrode wiring 4. Each element 5 is joined to the lower electrode wiring 4 by an electrode junction layer 8. Thus, the electrode junction layer is provided on only one side of each element. Therefore, the thermal resistance that electrode junctions have can be reduced and the possibility of contact failure at joining can also be reduced. As is apparent from the above, the electrode junction layer represents layers which join the electrodes and the elements electrically and mechanically by pressing and heating.

Relating specific materials and other features will be described below in detail.

A method for manufacturing a thermoelectric conversion device of the above-described construction will be described below.

First, a substrate processed to have an insulating effect or an insulating substrate is prepared, and an internal electrode wiring pattern for pn connection of p-type and n-type elements is formed on a surface of the substrate, thus forming a substrate for plating.

Next, a mask having holes for the elements is made on the plating substrate. It is necessary that the thickness of the mask be approximately equal to the sum of the thickness of the elements and the thickness of an electrode junction layer.

Next, the plating substrate and an opposed electrode are placed in a plating solution and the elements is caused to grow in the holes of the plating substrate by controlling the voltage or current.

Next, the electrode junction layer is shaped on the elements. For example, a material capable of preventing a solder, which is a constituent of the electrode junction layer, from being diffused in the elements is formed by electroplating, and the solder is then attached by electroplating.

This method uses the mask hole pattern to form the elements with faithful reproducibility with respect to their cross-sectional shape and positions, and therefore makes it possible to form any of rounded cross-sectional shapes, such as circular and elliptical shapes, and special shapes, e.g., a star-like shape, which are difficult to form by the conventional manufacturing methods. If the cross-sectional shape is circular, the problem of chipping or cracking of corner portions of the conventional elements can be eliminated. The number of holes in the mask pattern corresponds to the number of elements, and several ten thousand elements can be made at a time. Since the density of elements is determined only through the mask pattern, it is necessary to make the mask upon the thermal design and the performance design of the thermoelectric conversion element.

The mask on the plating electrode is then removed, and the metal layer on the plating substrate is etched and removed at places where the plating substrate is not covered with the electrode wiring pattern.

The completed electrode junction layers on the substrate are used for joining to a wiring electrode pattern on another substrate, thus making the thermoelectric conversion device.

The process of forming the plating substrate may be such that a multiplicity of metal layers are formed on the substrate surface, and an internal electrode wiring pattern for pn connection of the p-type and n-type elements is formed by using the multiplicity of metal layers. In such a case, no pattern is formed in at least one metal layer to enable electric conduction over the entire surface of the plating substrate. Plating is performed on the thus-constructed substrate to form the elements, and the metal layer in which no metal pattern is formed is partially removed. The thermoelectric conversion device may be made in this manner.

(Embodiment)

An embodiment of the thermoelectric conversion device in accordance with the present invention will be described below in detail.

As an application of the thermoelectric conversion device to power generation, use in a wristwatch capable of being driven by generated power on $\mu$W order can be mentioned. For example, a thermoelectric conversion device is designed so that when a temperature difference of 1 degree is generated between the two terminals of the thermoelectric conversion device in a wrist watch worn on a wrist at about room temperature, an open-circuit voltage of 1 V and power of 10 $\mu$W or more are obtained. If a thermoelectric conversion device having a square shape one side of which is not larger than 2 mm is constructed by using a compound semiconductor which is mainly constituted of the plurality of elements selected from Bi, Te, Sb, it has 2500 or more p-type and n-type element pairs, an element sectional area of 100 $\mu$m$^2$, and a height of 40 $\mu$m.

Figure 2:
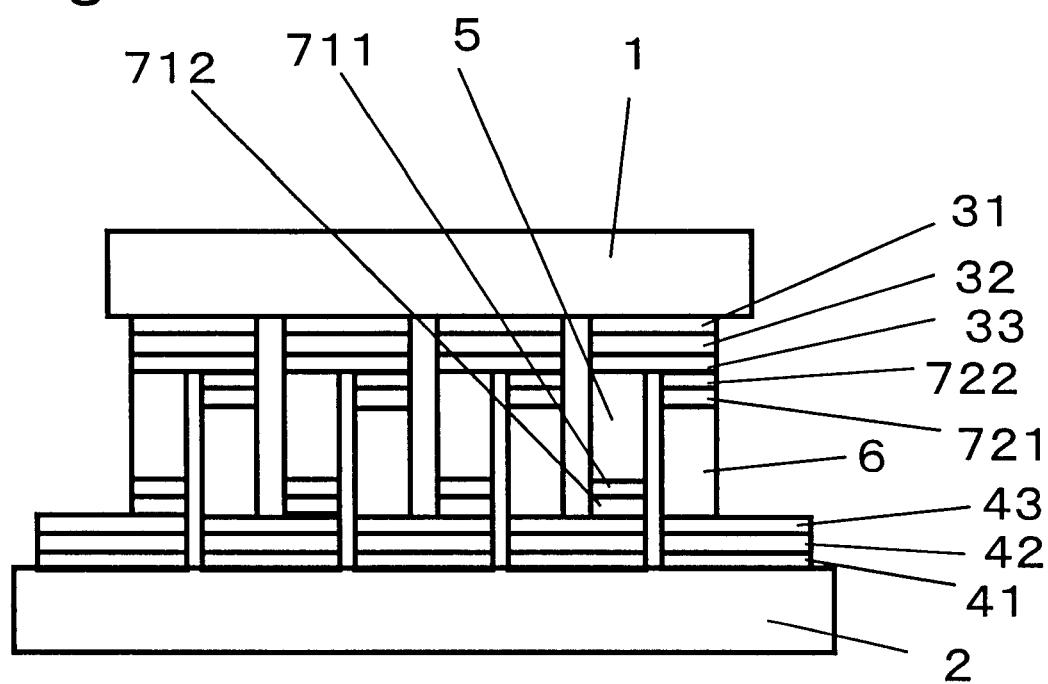
FIG. 2 is a side view of a thermoelectric conversion device according to an embodiment of the present invention.

The construction of thermoelectric conversion device according to the embodiment of the present invention will be outlined with reference to FIG. 2. A Si wafer having a thickness of several hundred microns is used as each of an upper substrate 1 and a lower substrate 2. This substrate material is most suitable if the flatness, handling, reliability and mass-producibility are considered. However, a SiO$_2$ layer having a thickness of several hundred nanometers is formed by thermal oxidization processing in order to insulate pn junction electrodes from each other. Other examples of substrate members or materials are a Cu or Al member having an insulated surface, and insulating materials, such as Al$_2$O$_3$ and AlN having high heat conductivity, and glass, etc. Any thickness of the substrate can be selected in the range of several ten microns to several centimeters according to the device strength design as to whether the thermoelectric conversion device itself has a sufficient body strength or it requires some support from an instrument using the thermoelectric conversion device. If the substrate is an insulating material, there is no need for processing for insulation. Processing for insulation of the substrate is not limited to thermal oxidization. Any of various film forming methods, such as coating, adherence, deposition, sputtering, etc., of an insulating material, may be used.

An upper electrode wiring 3 and a lower electrode wiring 4 are provided on the upper substrate 1 and the lower substrate 2, respectively. For example, the upper electrode wiring 3 and the lower electrode wiring 4 are formed by three metal layers, as illustrated. First metal layers 31 and 41 adjacent to the upper substrate 1 and the lower substrate 2, respectively, are provided mainly to set certain strengths of bonds of the upper substrate 1 and the lower substrate 2 to second metal layers 32 and 42. As a material for forming the first metal layers Cr or Al can be used. In this embodiment, a material having Cr as a main constituent is used. The intermediate second metal layers 32 and 42 are provided mainly to establish electrical series connections of pn junctions between n-type elements 5 and p-type elements 6. As a material for forming the second metal layers, Cu, Ni, Au, Ag, or Al can be used. In this embodiment, a metal layer having Ni as a main constituent is used. Third metal layers 33 and 34 are provided mainly to directly cause the n-type elements 5 and p-type elements 6, respectively, to grow. Also, the third metal layers 33 and 43 are each for junction to the electrode junction layer 7 of the opposed element. As a material for forming the third metal layers, Au, Pt, Ag, Ni or Ti, for example, can be used. In this embodiment, Au is used. As illustrated in FIG. 2, each third metal layer 43 on the lower substrate 2 is directly joined to the p-type element 6, and is joined to the n-type element 5 by the electrode junction layer. Conversely, each third metal layer 33 on the upper substrate 1 is directly joined to the n-type element 5, and is joined to the p-type element 6 by the electrode junction layer. The electrode junction layer is formed of a first electrode junction layer and a second electrode junction layer, as described below.

Figure 3:
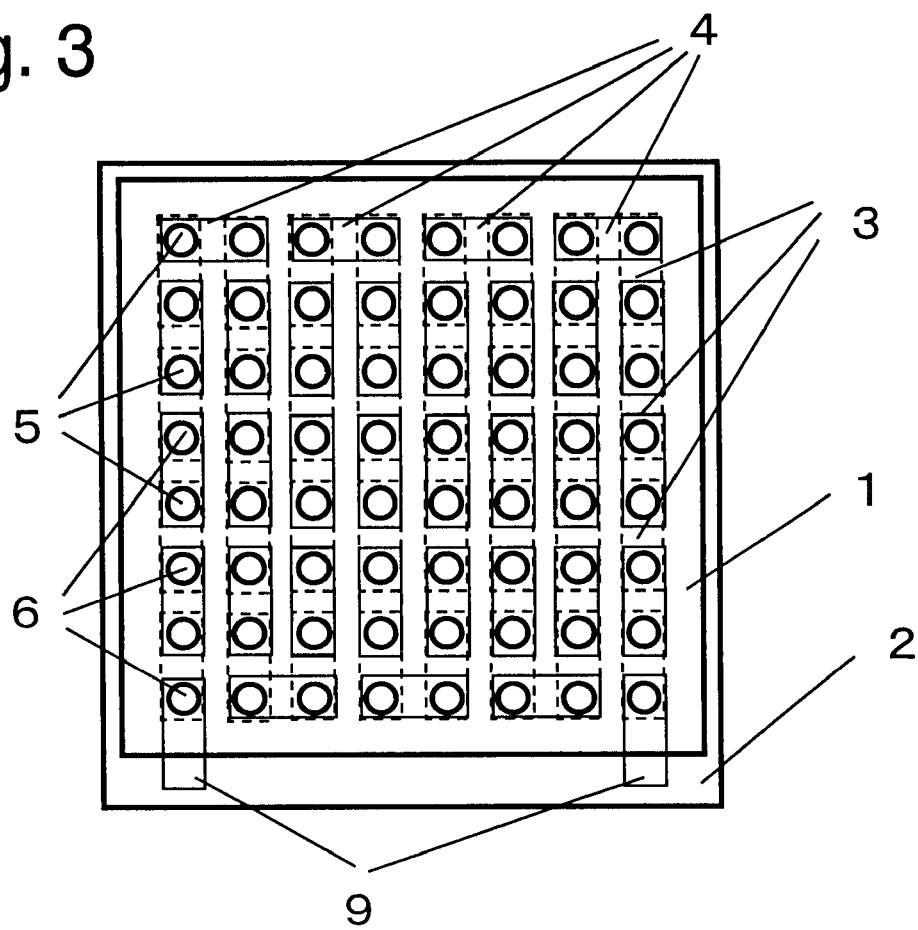
FIG. 3 is a top perspective view of the thermoelectric conversion device of the present invention.

The array of elements 5 and 6 in the thermoelectric conversion device will be described with reference to FIG. 3. As shown in FIG. 3, each element has, for example, the shape of a circular cylinder, and the p-type elements 6 and n-type elements 5 are alternately placed and are connected in series with each other by the upper electrode wiring 3 attached to the upper substrate 1 and the lower electrode wiring 4. More specifically, the p-type and n-type elements 5 and 6 are orderly placed alternately at constant periodic intervals, and are connected in series while being arranged alternately upwardly and downwardly from one side to the opposite side as viewed in the figure. The p-type and n-type elements 5 and 6 are connected to an external electrical circuit by external connection electrodes 9. Seventy two circular cylinders having a diameter of 10 $\mu$m are actually arranged with a 30 $\mu$m pitch to form each of seventy vertical rows which are arranged in the horizontal direction with the same pitch, although the array illustrated in FIG. 2 or 3 does not have 5000 elements. The elements are thus connected in series to form the thermoelectric conversion device having a 2.5 mm square shape. The arrangement of the p-type and n-type elements and the intervals between the elements are not particularly limited. The elements may be irregularly spaced, may be arranged spirally, and may vary in size. Although the upper substrate 1 is so illustrated as to be seen smaller than the lower substrate 2, it may alternatively be equal to or larger than the lower substrate 2. Even the parallelism between the upper and lower substrate is not always necessary. The elements need not be circular and may have a polygonal sectional area rounded at corners.

Figure 4A:
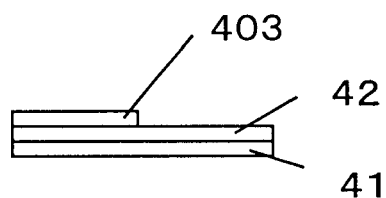
FIG. 4A is a schematic diagram showing a side view of connection electrodes according to the present invention.
Figure 4B:
FIG. 4B is a schematic diagram showing a top view of connection electrodes according to the present invention.
Figure 5A:
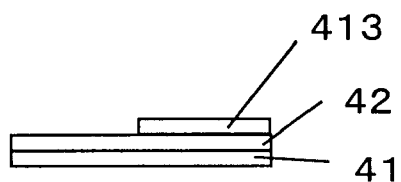
FIG. 5A is a schematic diagram showing a side view of connection electrodes according to the present invention.
Figure 5B:
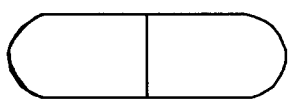
FIG. 5B is a schematic diagram showing a top view of connection electrodes according to the present invention.
Figure 6A:
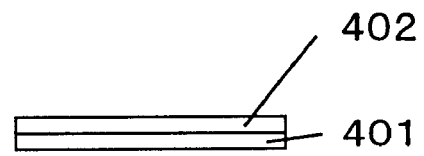
FIG. 6A is a schematic diagram showing a side view of connection electrodes according to the present invention.
Figure 6B:
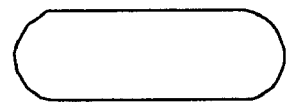
FIG. 6B is a schematic diagram showing a top view of connection electrodes according to the present invention.

In this embodiment, the first, second and third metal layers are formed of Cr, Ni and Au, respectively, and have thickness of 100 nm, 5 $\mu$m and 200 nm, respectively. However, this combination, this number of layers and these thicknesses are not exclusively selected. For example, the thickness of the Cr layer may be set within the range of several ten to several hundred nanometers, the thickness of the Ni layer in the range of several hundred nanometers to several micrometers, and the thickness of the Au layer in the range of several ten to several hundred nanometers with no problem. If the material of one layer is changed, the thickness of the layer may be adjusted according to the function of the layer. The number of layers may be reduced to two by integrating the functions, or five or more layers may be formed by separating the functions. FIGS. 4 to 6 show variations of the layer structure of the lower electrode wiring, i.e., a two-layer structure and three-layer structure, by way of example. FIGS. 4A, 5A and 6A are side views and FIGS. 4B, 5B and 6B are top views. FIGS. 4A and 4B show an example of a three-layer structure, in which a third metal layer 403 is formed below the space where an element is to grow. Referring to FIGS. 5A and 5B, a third metal layer 413 is formed only as a portion joined to an electrode junction layer 107. In the case of a two-layer structure such as shown in FIGS. 6A and 6B, only a first metal layer 401 and a second metal layer 402 constitute the structure.

The electrode wirings 3 and 4 on the upper substrate 1 and the lower substrate 2 of this embodiment have been described by assuming that they have the same structure. The electrode wirings 3 and 4, however, may have different structures. For example, Ni is used to form the second metal layer on one of the two substrates while a Cu layer coated with Ni is used on the other substrate in a case where, in the operating state, the temperature on the upper substrate 1 side is higher than that on the lower substrate 2 side, or if it is desirable to reduce the electrical resistance, to improve the facility with which the device is manufactured, or to ensure a certain degree of reliability of the device. Ni has been used for conventional thermoelectric devices and has high reliability, but its electrical resistance is higher than that of Cu. Therefore, it is sometimes disadvantageous to use only Ni for extremely small thermoelectric conversion devices in which a multiplicity of elements are connected in series. Conversely, if Cu is used, it dissolves easily in a nitric acid acidic plating solution and easily allows diffusion of materials and is therefore unsatisfactory in terms of reliability, although it has a low electrical resistance. Therefore, it is desirable to use a combination of Ni and Cu. However, an increase in the total number of layers leads to an increase in cost. For this reason, the above-described material composition has been usable according to the balanced relationship among the electrical resistance, the reliability and the cost. Also, the structures of the upper electrode wiring 3 and the lower electrode wiring 4 may be differentiated from each other as shown in FIGS. 4 to 6.

The n-type element 5 is mainly constituted of Bi and Te. The constituent ratio Bi/Te in terms of molar ratio is about 2/3. The p-type element 6 is mainly constituted of Bi, Sb and Te. The constituent ratio (Bi+Sb)/Te in terms of molar ratio is about 2/3. These elements are electrochemically composed in a nitric acid acidic solution at pH 1 or lower used as a plating liquid. Therefore, the crystal grain size is not larger than several microns and the C-axes of Bi-Te crystals are oriented in the direction perpendicular to the direction of growth of layers.

Referring to FIG. 2, the Bi—Te alloy is directly formed on the connection electrodes (i.e., on upper electrode wiring 3 and lower electrode wiring 4). However, a thin interposed layer of Pt, Ni, Au, Bi or the like may be formed by plating and the elements may be formed on this layer. An improvement in thermoelectric characteristics, an increase in bond strength, etc., can be achieved thereby.

The electrode junction layer formed on an end of each of the p-type elements 6 and n-type elements 5 is formed of two metal layers, i.e., a first electrode junction layer and a second electrode junction layer. First electrode junction layers 711 and 721 bond second electrode junction layers 712 and 722 to the elements 5 and 6, respectively, and prevent elements in the second electrode junction layers 712 and 722 from being diffused in the elements 5 and 6. In this embodiment, a 1 $\mu$m Ni layer is used as the first electrode junction layer, but the first electrode junction layer is not limited to this. For example, Pt, Ti, Au or Ag may be used. Also, the number of layers may be increased, or may be reduced to one. The electrode junction layers may differ in composition from each other with respect to the elements.

Figure 7:
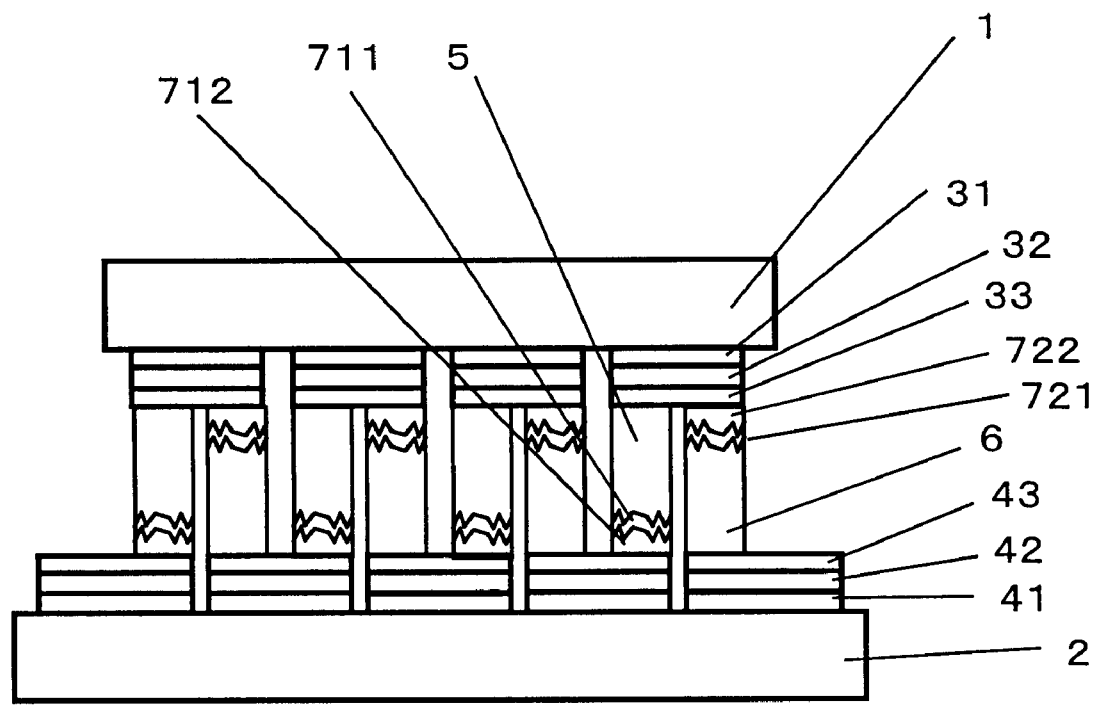
FIG. 7 is a side view of another thermoelectric conversion device of the present invention.

FIG. 7 shows a structure in which the surfaces of the p-type elements 6 and n-type elements 5 on which the electrode junction layers are have some sort of irregularities. Such a structure has an effect of improving the strength of the junctions between the second electrode junction layers 712 and 722 and the first electrode junction layers 711 and 721. Consequently, the strength of the junctions between the second electrode junctions layers 712 and 722 and the elements is improved. In this figure, however, the configuration of the interface is illustrated in an extremely magnified state. The actual configuration is not so extremely irregular, and the irregularities are only relatively large in comparison with the surfaces of the elements 5 and 6 not joined to the electrode junction layers. More specifically, when the surface roughness was on the order of several microns corresponding to the size of crystal grains of the Bi—Te alloy, the above-mentioned improvement in the junction strength could be achieved. Since Bi—Te materials can oxidize easily, electrode junction layers having a sufficiently high bond strength could be formed on the elements upon realizing such surface roughness.

Each of the second electrode junction layers 712 and 722 has a function of electrically and mechanically connecting the third metal layer 33 or 43 on the lower or upper substrate to the element 5 or 6. For example, a solder mainly composed of Sn and Pb is used for this purpose. In this embodiment, however, a solder mainly composed of Bi, Ag, and Sn without Pb, or a silver paste may be used.

The method of manufacturing the thermoelectric conversion device shown in FIG. 2 will now be described in detail with reference to FIGS. 8 to 13. First, a substrate 101 for plating is made. For example, if a Si wafer is used as a substrate, thermal oxidization is first performed to form a 100 nm thick $SiO_2$ layer on the surface, thus performing processing for electrical insulation. A multilayer structure having, for example, three metal layers is then formed on the surface by sputtering, vacuum deposition or CVD.

Figure 8A:
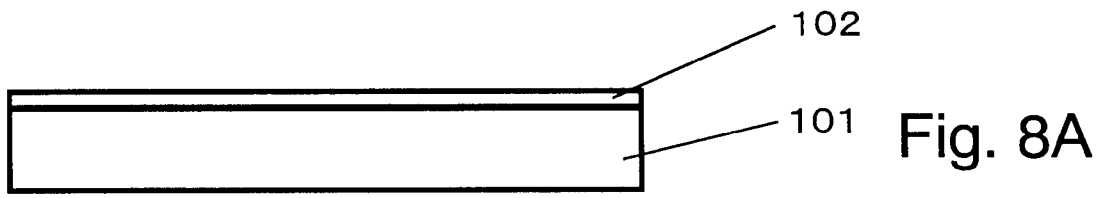
FIGS. 8A to 8D are side views (1) schematically showing a method of manufacturing the thermoelectric conversion device of the present invention.

First, as shown in FIG. 8A, a first metal layer 102 was formed on the entire surface of the substrate 101.

Figure 8B:
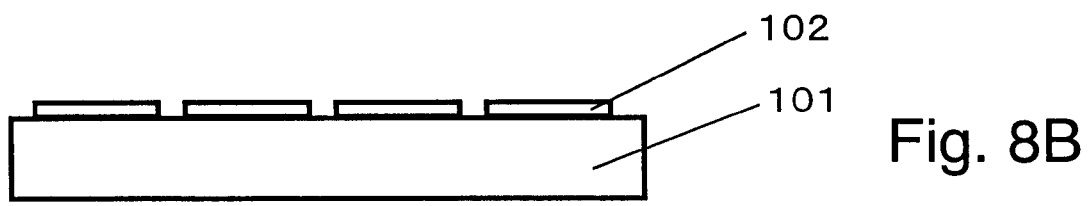

Next, this first metal layer 102 was etched to be shaped into a pattern for forming an electrode wiring such as shown in FIG. 8B. To form an internal electrode wiring by etching, a photosensitive resin is first applied and is subjected to exposure by an exposure apparatus. The electrode wiring has a land-like configuration for pn connection of p-type elements and n-type elements. Accordingly, if a negative type photosensitive resin is used, the mask pattern has a land-like configuration. If a positive type photosensitive resin is used, a reversal mask is used. After exposure, development using a developer solution was performed along the mask pattern, thereby forming a pattern in the photosensitive resin. The metal layer not protected by the resist was etched by an etching solution.

Figure 8C:
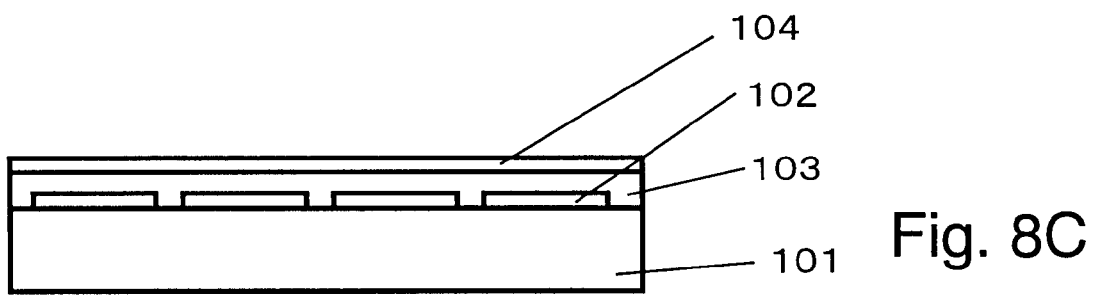
Figure 8D:
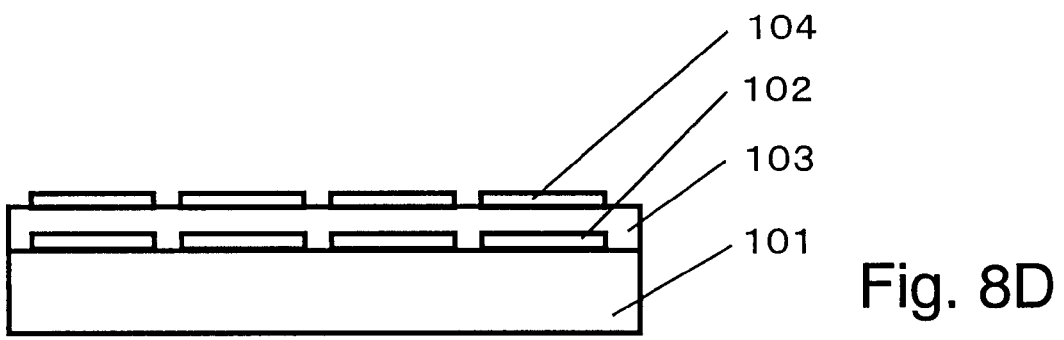

Next, as shown in FIG. 8C, a second metal layer 103 and a third metal layer 104 were formed on the entire surface of the substrate 101. Thereafter, only the third metal layer 104 was etched to form a pattern for forming an electrode wiring such as shown in FIG. 8D. As can be understood from this, the second metal layer 103 is left without being shaped into a pattern in order to enable conduction over the entire surface of the substrate 101. The layer forming method used is sputtering using 3-inch metal targets. The materials used for the metal layers and the film thicknesses were as shown below. The first metal layer 102 was a 100 nm thick Cr layer, the second metal layer 103 was a several-microns thick Ni layer, and the third metal layer 104 was a 100 nm thick Au layer.

In this embodiment, the metal layers were formed on the plating substrate 101 in the above-described order. However, a process described below is also possible. First, three metal layers are formed. Then, a land-like electrode wiring pattern is formed only in the second metal layer 103 and the third metal layer 104, and no pattern is formed in the first metal pattern 102. This process also enables conduction through all the electrodes for precipitation of p-type and n-type elements. In this process, the lowermost metal layer is left by controlling the etching time. However, it is also possible to leave only the lowermost metal layer by selecting a suitable etching solution. Cr forming the first metal layer formed as the lowermost layer could be cleanly etched by immersion in a ferricyanic water solution for several minutes after element shaping, without corroding the other materials. It is also possible to form a pattern only in the uppermost layer without forming any patterns in the other two layers. As a metal layer growing method, a vacuum deposition method, a CVD method or a plating method may also be used in addition to a sputtering method.

The substrate 101 for growth of p-type or n-type elements was thus prepared.

Figure 9A:
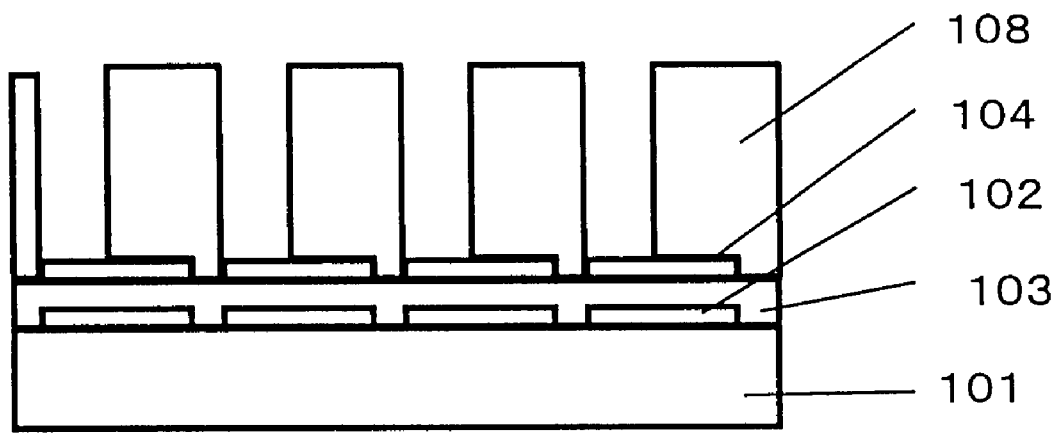
FIGS. 9A and 9B are side views (2) schematically showing the method of manufacturing the thermoelectric conversion device of the present invention.

Next, a mask 108 for shaping p-type or n-type elements was made on the plating substrate 101, as shown in FIG. 9A. The description will be made below in detail with respect to the formation of n-type elements. A photosensitive resin is used for the mask 108, and portions not masked correspond to about half the areas of the above-described land-like electrode wiring pattern. More specifically, the shape of openings on the electrodes left by the mask 108 is circular. The shape not masked may be the shape of a polygon rounded at corners. A specific method for forming the mask 108 is as described below. For example, a photosensitive resin is applied to the entire surface of the plating substrate, made flat by a spinner, dried and then baked, followed by exposure and development. Since the height of n-type elements was 40 $\mu$m, the rotation of the spinner was set at a low speed to enable the photosensitive resin to have a thickness of about 50 $\mu$m. It is necessary to set the thickness of the photosensitive resin larger than the desired height of n-type elements. Alternatively, the steps of applying the photosensitive resin and the step of baking the photosensitive resin may be performed a number of times to shape a thick layer of the photosensitive resin on a substrate. If the overall thickness is increased to several hundred microns, a need for applying the photosensitive resin a certain number of times arises. If still a larger thickness (millimeter order) is required, a technique such as screen printing may be used.

Basically, the sectional shape of each of p-type and n-type elements is reflected by the mask pattern at the time of exposure. However, since the photosensitive resin had a substantially large thickness and since the element was thin, that is, the diameter of its sectional shape was set to 10 $\mu$m, the diameter of the corresponding mask pattern shape was set to 10 $\mu$m or less. After exposure, development is performed to form holes for n-type elements. While in this process the sectional shape of n-type elements is strictly made circular based on the mask pattern, the holes for the elements can be rounded by exposure conditions and development conditions. It is also possible to form a polygonal sectional shape having rounded corner portions in the same manner. It is also possible to form a mask for the p-type on another substrate in the same manner.

Figure 9B:
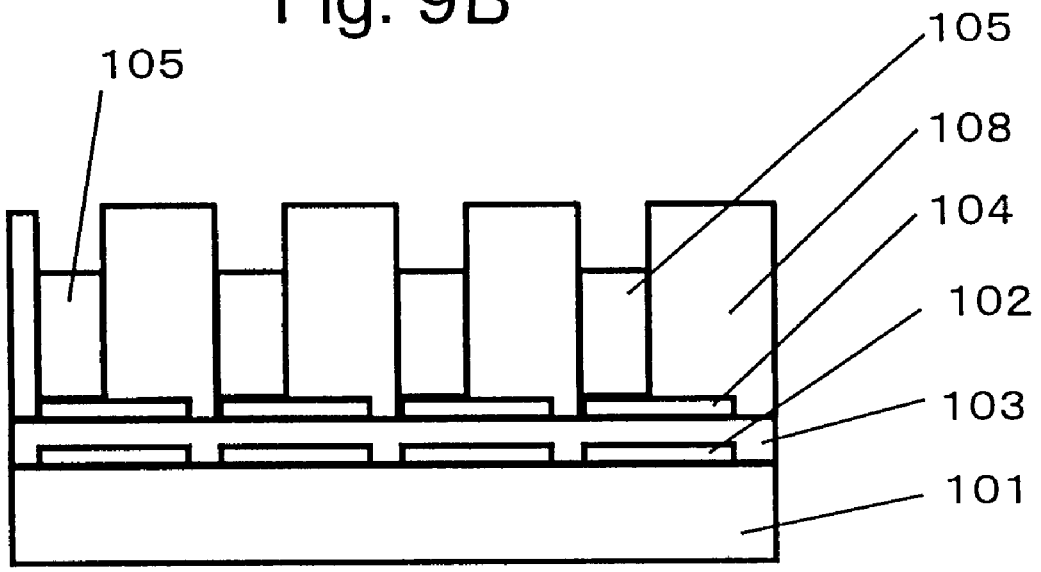

Next, as shown in FIG. 9B, n-type elements 105 were formed by plating in the holes of the mask 108 on the substrate 101. Plating in the holes of the mask 108 requires a pretreatment for enabling a plating solution to enter the resist holes and suitably wet the electrode surface. In this embodiment, therefore, a pretreatment based on ultrasonic cleaning using a plating solution was performed. A method of burning by a plasma in an oxygen atmosphere may also be used as a method for completely removing remaining resist layers in the resist holes. A method for enabling a plating solution to enter the resist holes by performing ultrasonic cleaning using pure water, an acid, an alkali, a detergent, or the same kind of plating solution having a lower viscosity may be performed. Also, a technique of introducing a plating solution by evacuating the plating electrode spaces, etc., may be used.

An acid water solution is basically used as a plating solution and the pH value thereof is 1 or less. Specifically, nitric acid was used. However, hydrochloric acid and sulfuric acid can also be used. As plating solution constituents, Bi and Te are contained for the n-type, and Bi, Te and Sb are contained for the p-type. Each of plating solutions having such constituents is prepared by dissolving metallic materials in a nitric acid water solution. Raw materials for the plating solutions are provided in the form of oxides, chlorides or pure metals. Bi, Te and Sb are difficult to dissolve even in an acid at a low pH. Therefore, they may be combined with some of various chelating agents, e.g., aminopyridine to improve the solubility, thereby increasing the film forming rate in plating.

To compose the Bi—Te alloy by plating, the substrate 101 with mask holes was used as a working electrode, and a platinum electrode or a titanium electrode coated with platinum was used as an opposed electrode. They were immersed in the above-described plating solution. The alloy could be composed by causing a current at a current density on 1 mA/cm$_2$ order in the solution. If a reference electrode made of Ag/AgCl or the like is used, the Bi—Te alloy can be composed with higher reproducibility by performing voltage control. That is, agitation of the plating solution and voltage and current control are performed to facilitate reproduction of a roughness of several microns corresponding to the crystal grain size of the Bi—Te alloy.

On the connection electrodes as a substrate for the growth of the elements, a thin layer of another metal such as Pt, Ni, Au or Bi, may be previously formed by electroplating to increase the surface roughness of the substrate metal, and the elements may be formed on this layer, thereby improving the bond and preventing diffusion of element materials.

Figure 10A:
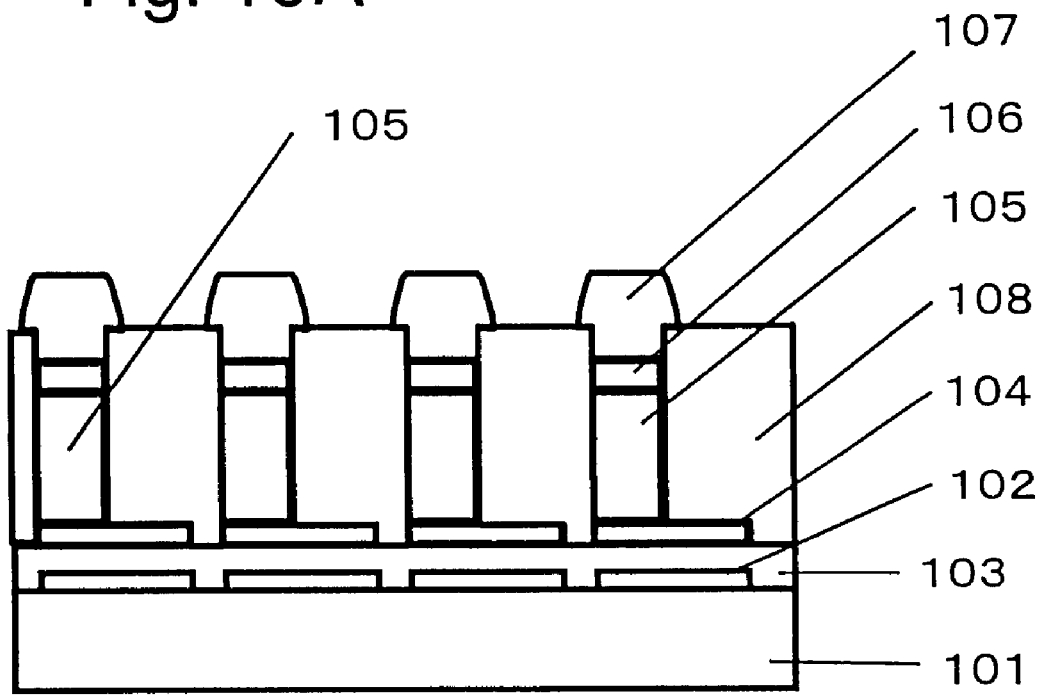
FIGS. 10A and 10B are side views (3) schematically showing the method of manufacturing the thermoelectric conversion device of the present invention.

Next, as shown in FIG. 10A, an electrode junction layer was formed on the elements 105. At this time, the same plating method is used to form this layer in this embodiment. Since the same plating method was used, the plating baths were placed close to each other to minimize oxidation of the surface used as a plating interface, thereby improving the plating junction strength. First, a layer of a material such that a solder or the like forming a second electrode junction layer 107 is not diffused in the element 105, e.g., a material having Ni as a main constituent is formed by plating as a first electrode junction layer 106. Thereafter, a solder having Sn and Pb as a main constituents and forming the second electrode junction layer 107 is shaped by a plating method. A lead-free solder containing Bi or Ag could also be used, and Pt, Ag and Au could also be used as the first electrode junction layer 106. The electrode junction layer was formed by a plating method. However, sputtering, CVD or screen printing may also be used. When a silver paste was used for the second electrode junction layer 107, the second electrode junction layer 107 was shaped by immersing the tip of the element in a silver paste bath after separation of the photosensitive resin. The number of electrode junction layers is not limited to two, and may be one, or three or more.

Figure 10B:
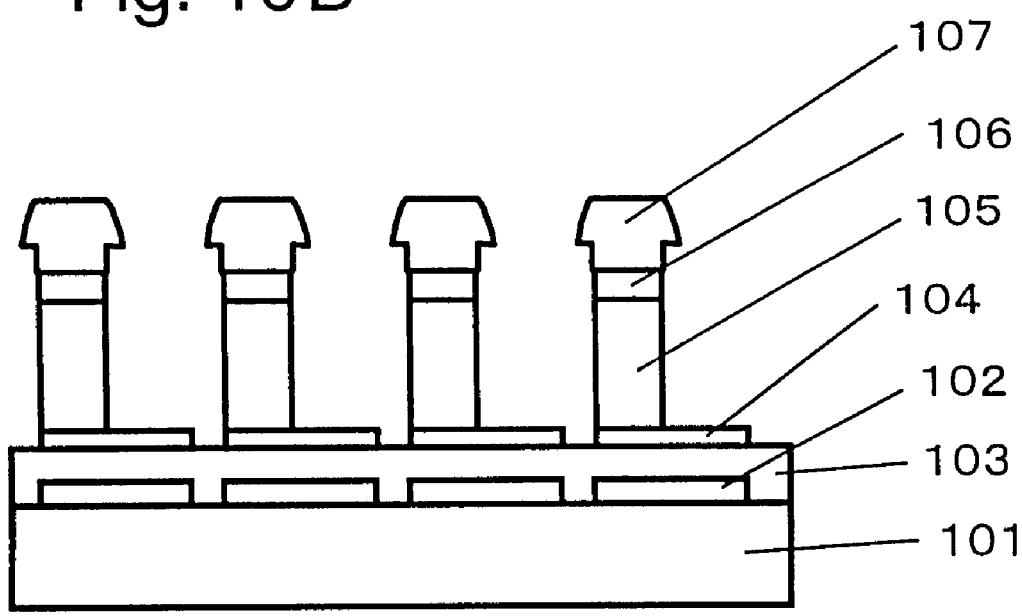

Next, as shown in FIG. 10B, the photosensitive resin (mask 108) on the plating electrode on the substrate 101 is removed. A removal method using a photosensitive resin remover or an organic solvent such as acetone may be used. In this embodiment, ultrasonic cleansing was performed in acetone to remove the resin in a short time period.

Figure 11A:
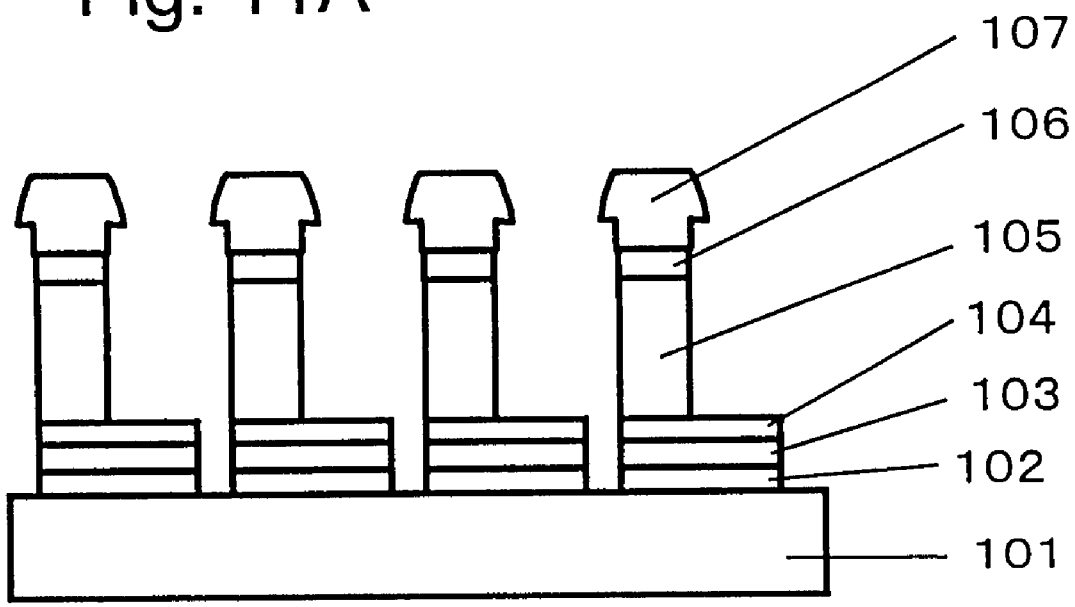
FIGS. 11A and 11B are side views (4) schematically showing the method of manufacturing the thermoelectric conversion device of the present invention.

Next, the metal layer on the substrate 101 which is used as a plating conduction electrode, and in which no pattern is formed is partially removed. FIG. 11A shows the result of this removal. In this embodiment, the third metal layer 104 in which the electrode pattern had already been formed was used as an etching mask. An etching solution capable of easily removing Ni without corroding the third metal layer (Au) and forming the wiring electrode pattern was used. However, it is to be noted that an etching solution should be selected which does not considerably dissolve Bi, Te and Sb, which are the main constituents of the elements fixed on the substrate 101, and Sn and Pb, which are the main constituents of the solder.

Figure 11B:
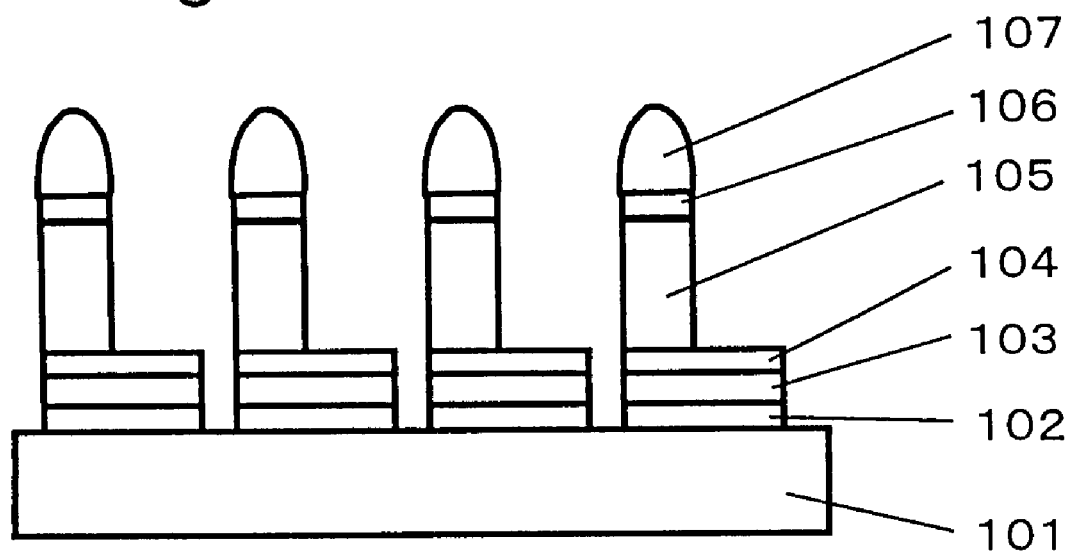

Next, reflowing of the electrode junction layers is performed. FIG. 11B shows the result of the reflowing. By performing reflowing, the constituents of the second electrode junction layer 107 are made uniform and the junction to the mated metal layer is facilitated. Reflowing was performed in such a manner that a rosin flux was applied to the soldered portions and a heat treatment was performed at 170° C. for several ten seconds or less. The gas of the inert gas atmosphere is Ni, Ar or the like. A heat treatment may be performed in atmospheric air.

Figure 12:
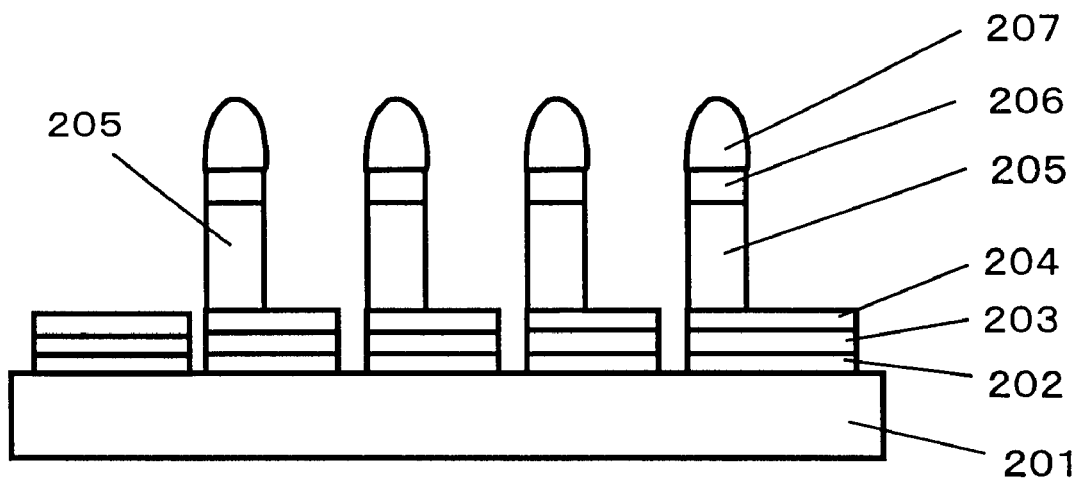
FIG. 12 is a schematic diagram showing the structure of an opposed substrate.

Next, a substrate on the opposite side, having a similar structure such as shown in FIG. 11B is prepared. The substrate may have elements shaped thereon by the above-described method, or elements formed by any other method. In this embodiment, p-type elements 205 are provided on an opposed substrate 201 with three layers 202, 203, and 204 interposed therebetween, and a first electrode junction layer 206 and a second electrode junction layer 207 are provided on the p-type elements 205, as are the corresponding members described above. FIG. 12 shows this construction.

Figure 13:
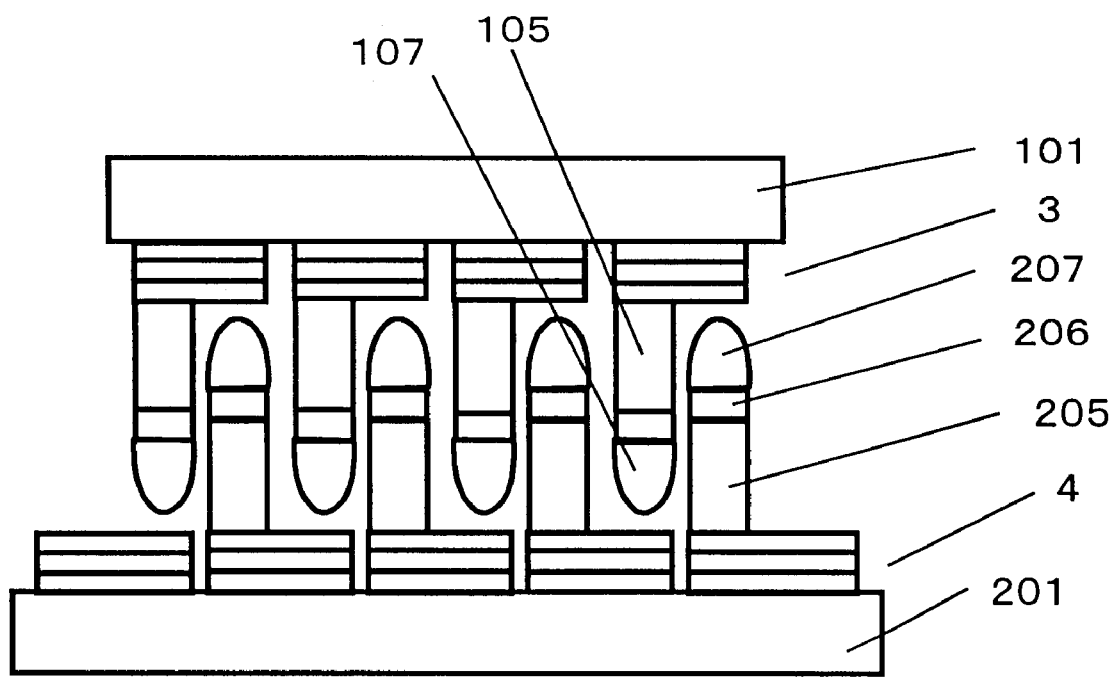
FIG. 13 is a side view showing a state where two substrates with p-type and n-type elements are joined.
Figure 14:
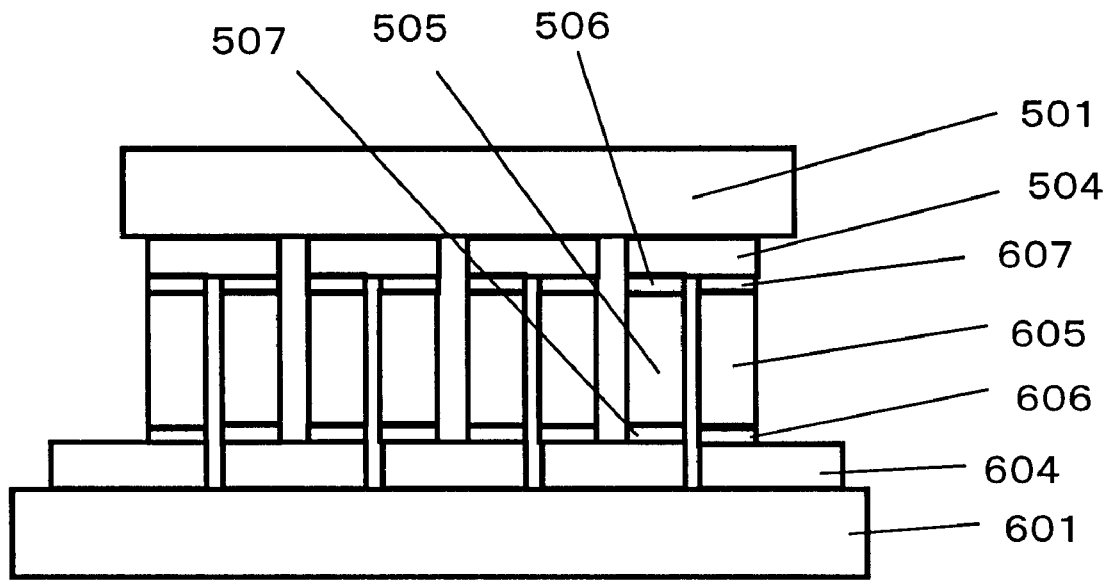
FIG. 14 is a side view of a conventional thermoelectric conversion device.
Figure 15:
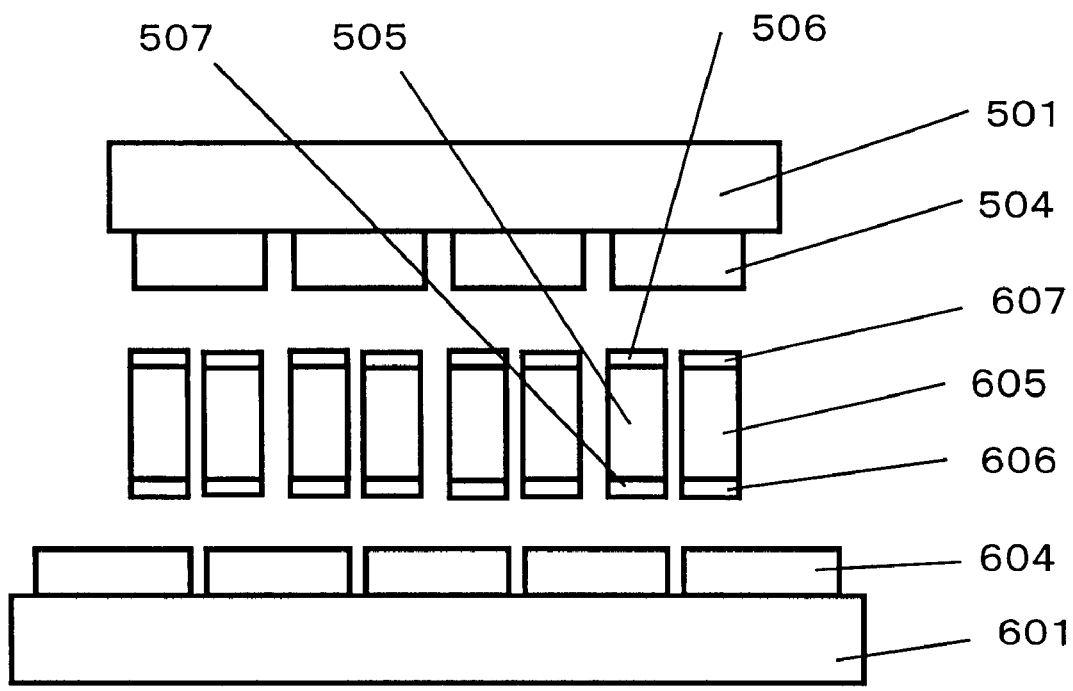
FIG. 15 is a side view schematically showing a conventional method for manufacturing a thermoelectric conversion device.
Figure 16:
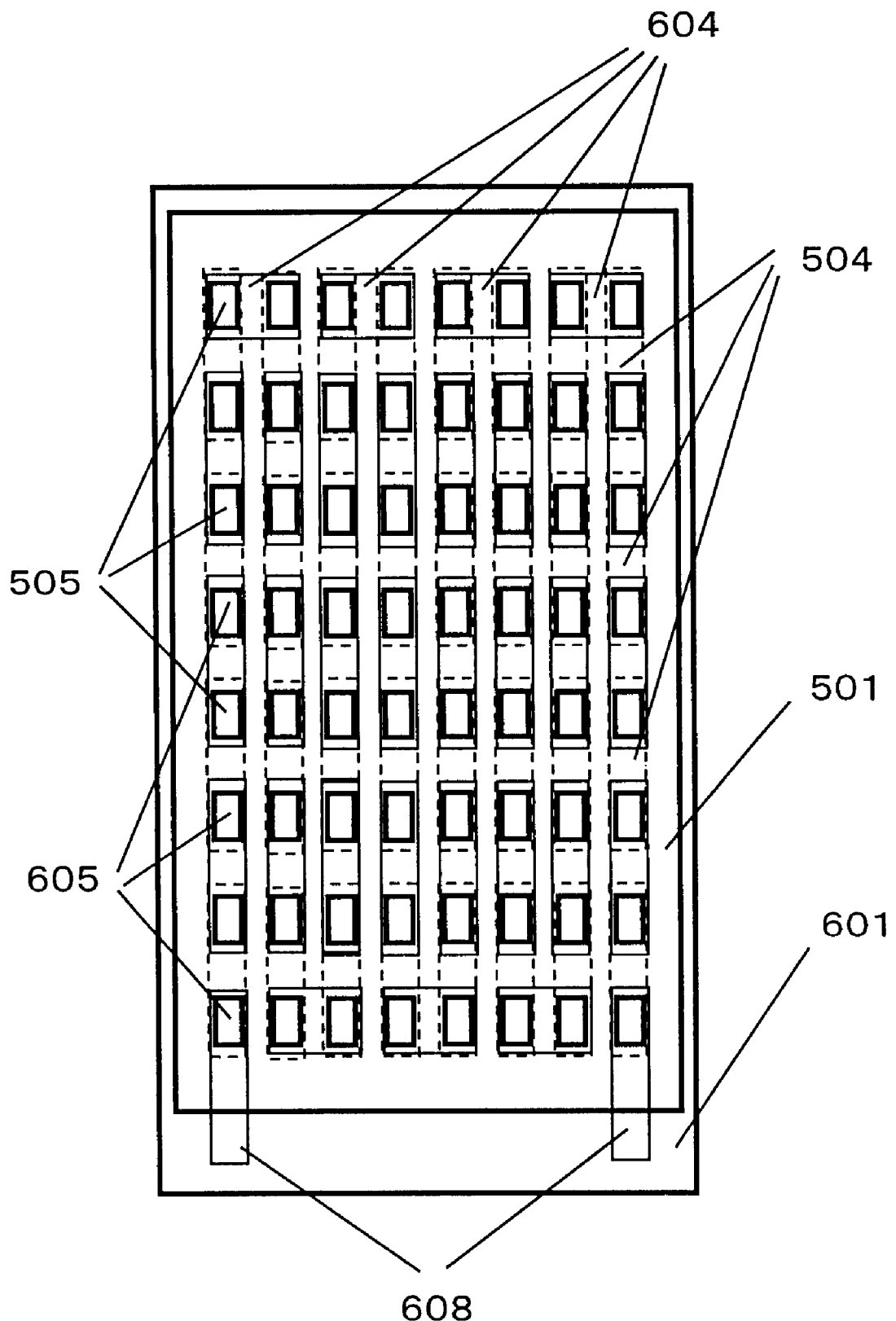
FIG. 16 is a top perspective view of the conventional thermoelectric conversion device.

Next, as shown in FIG. 13, the substrate 201, to which the p-type elements 205 are attached, and the substrate 101, to which the n-type elements 105, are opposed and joined to each other. If necessary, the two substrates are cut into pieces having predetermined suitable sizes. The faces of the respective substrates 101 and 201 on which the elements are provided are opposed to each other, the elements on the respective substrates are placed in a staggering manner, and the elements with the electrode junction layers are positioned on the electrode patterns on the substrates. Then the members were heated while being pressed against each other. The positioning of the respective substrates 101 and 201 is performed on one side of each of the substrate to align the joining positions of the substrates. In the positioned state, the members are heated while pressures are being applied to the substrates from above and below, thereby effecting joining between the electrodes on the opposed substrates by the electrode junction layers. The heating temperature is not higher than 350° C. Joining was performed in an air atmosphere. However, joining may also be performed in a vacuum or in an inert gas atmosphere, such as a nitrogen atmosphere or an Ar atmosphere. A rosin flux was applied to the bump heads to reduce junction failures, thereby achieving a high yield. In this embodiment, after joining using a heater, the thermoelectric conversion device was moved away from the heater to solidify the solder by natural cooling. However, forced cooling using a Peltier device or a fan can also be used.

The thermoelectric conversion device thus made has the structure shown in FIG. 3.

Finally, to improve thermoelectric characteristics, the thus-made thermoelectric conversion device is put in a furnace to undergo a heat treatment. In this embodiment, a heat treatment was performed to improve the thermoelectric characteristics of the elements. However, with respect to specifications not requiring improved thermoelectric characteristics, the plating conditions are suitably controlled to attain the performance according to a purpose without performing a heat treatment.

According to the thermoelectric conversion device of the present invention, as described above, the elements have a circular sectional shape or polygonal sectional shape rounded at corners, so that the possibility of breakage due to stresses is reduced. Also, the interface between the elements and the electrode junction layers is suitably roughened to have a surface roughness of several microns or less, thereby improving bonding and stably reducing the loss of heat and the electrical resistance. Also, the electrode junction layers could be reduced to half in comparison with the conventional thermoelectric conversion device. Therefore, occurrence of manufacturing defects, the electrical resistance and the heat loss at the electrode junction layers could be reduced.

In the manufacturing method, a pattern is determined by a photosensitive resin, so that the elements can be made finer and can be formed at a high density. Since the elements are shaped by a plating method, the thickness of the elements is readily reduced. Reductions in thickness and size and an increase in density could be realized and the performance substantially the same as that of the conventional thermoelectric conversion devices could be realized by using a smaller number of members or smaller amounts of materials, thereby achieving a reduction in cost.

What is claimed is:

1. A thermoelectric conversion device comprising:

two substrates having an internal electrode;

p-type and n-type elements formed of thermoelectric materials, interposed between the two substrates, and pn-junctioned by wiring of the internal electrode; and at least one of the p-type and n-type elements having, on only its one side, an electrode junction layer for joining to the internal electrode.

2. A thermoelectric conversion device according to claim 1, wherein the element is formed of a thermoelectric material containing at least two elements selected from Bi, Te, and Sb precipitated from an acid water solution by an electrochemical technique.

3. A thermoelectric conversion device according to claim 1, wherein the electrode junction layer is formed of a plurality of layers.

4. A thermoelectric conversion device according to claim 3, wherein the electrode junction layer has a layer having Ni as a main constituent, and a layer containing at least one kind of element selected from Ag, Pb, Sn, and Bi.

5. A thermoelectric conversion device according to claim 1, wherein the sectional shape of the p-type element or the n-type element is circular or elliptical.

6. A thermoelectric conversion device according to claim 1, wherein a surface of the element adjacent to the electrode junction layer has a surface roughness larger than a surface adjacent to the internal electrode opposite from the surface adjacent to the electrode junction layer.

7. A thermoelectric conversion device according to claim 1, characterized in that the internal electrode has a conductive layer for pn junction, and a junction layer for joining the substrate and the conductive layer.

8. A thermoelectric conversion device according to claim 7, characterized in that the conductive layer is a metal layer having Ni as a main constituent.

9. A thermoelectric conversion device according to claim 1, wherein the internal electrode has a plurality of conductive layers.

10. A thermoelectric conversion device according to claim 1, wherein the substrates are Si substrates having a $SiO_2$ layer formed on a surface.

11. A thermoelectric conversion device comprising:

a first substrate and a second substrate each having an internal electrode; and p-type and n-type elements interposed between the first substrate and the second substrate, pn-junctioned by wiring of the internal electrodes, and formed of thermoelectric materials; wherein the p-type element has an electrode junction layer only on a surface jointed to the internal electrode of the first substrate, and the n-type element has an electrode junction layer only on a surface jointed to the internal electrodes of the second substrate.

12. A method of manufacturing a thermoelectric conversion device comprising:
   a first step of forming an internal electrode on a substrate;
   a second step of forming a mask pattern on the substrate such that at least a portion of the internal electrode is exposed;
   a third step of forming an element of a thermoelectric material on the exposed internal electrode by plating the substrate by an electrochemical technique;
   a fourth step of forming an electrode junction layer on the element;
   a fifth step of removing the mask pattern; and
   a sixth step of forming a pn junction by joining the electrode junction layer and an electrode provided on an opposed substrate opposed to the substrate.

13. A method of manufacturing a thermoelectric conversion device according to claim 12, wherein:
   the first step is a step of forming a plurality of internal electrodes for pn junction on the substrate and forming a second electrode for electrically connecting the plurality of internal electrodes; and further comprising
   a step of removing a portion of the second electrode so as to cancel electrical connection between the plurality of internal electrodes is provided after the fifth step.

14. A method of manufacturing a thermoelectric conversion device according to claim 12, further comprising a step of processing the element by a heat treatment.

15. A method of manufacturing a thermoelectric conversion device comprising the steps of:
   providing a metallic material on a substrate;
   forming a mask pattern on the substrate so that at least a portion of the metallic material is exposed;
   forming an element of a thermoelectric material on the exposed metallic material by plating the substrate by an electrochemical technique;
   forming an electrode junction layer on the element;
   removing the mask pattern;
   forming an electrode for pn junction by partially removing the metallic material; and
   joining the electrode junction layer and an electrode provided on an opposed substrate opposed to said substrate.

16. A method of manufacturing a thermoelectric conversion device according to claim 15, further comprising a step of processing the element by a heat treatment.

17. A method of manufacturing a thermoelectric conversion device comprising the steps of:
   forming a first metal layer on a substrate;
   forming a plurality of internal electrodes by patterning on the first metal layer;
   forming a mask pattern on the substrate so that the internal electrodes are exposed at least partially;
   forming an element of a thermoelectric material on the exposed internal electrodes by plating the substrate by an electrochemical technique;
   forming an electrode junction layer on the element;
   removing the mask pattern;
   forming an electrode pattern from the first metal layer by etching the first metal layer using the internal electrodes as a mask; and
   forming pn junction by pressing and heating the electrode junction layer and an electrode provided on an opposed substrate opposed to the substrate so that the electrode junction layer and the electrode are joined to each other.

18. A method of manufacturing a thermoelectric conversion device according to claim 17, further comprising a step of processing the element by a heat treatment.

* * * * *